Nov. 30, 1965 R. L. WHITE 3,221,183

SOLID-STATE CONTROLLED RECTIFIER RELAY

Filed Oct. 3, 1961

RICHARD L. WHITE
INVENTOR

BY M. Jabin

ATTORNEY

United States Patent Office 3,221,183
Patented Nov. 30, 1965

3,221,183

SOLID-STATE CONTROLLED RECTIFIER RELAY

Richard L. White, 432 W. Sierra Madre Ave., Glendora, Calif.

Filed Oct. 3, 1961, Ser. No. 142,581
10 Claims. (Cl. 307—88.5)

The present invention relates to solid-state relays, and more particularly to solid-state relays using controlled rectifiers.

There are many different kinds of relays presently in use, but most of them are mechanical types having moving parts, and it is often undesirable to use a relay having moving parts. Relays that are entirely electronic are usually undesirably complex. The use of controlled rectifiers in a relay solves these problems.

The controlled rectifier has firmly established itself in the semiconductor industry and shows promise of being useful in ever-increasing fields of application. Its use as a replacement for the thyratron dramatizes its wide acceptance in circuits requiring high power switching. In many applications, the controlled rectifier will render virtually obsolete, and establish as impractical, the use of power transistors and high current rectifiers, as well as the above-mentioned thyratron.

Basically, the controlled rectifier is a solid state device which may be used for switching high current circuits. Similar to the conventional switch, it has both an "on" and an "off" state. The switching or gate current required is but a fraction of its total current carrying capability.

Its operation may be compared to that of an NPN transistor ($T_1$) directly coupled to a PNP transistor ($T_2$), where the base current of $T_1$ is equivalent to the gate current of the controlled rectifier. With the base of $T_1$ connected to the collector of $T_2$, and the base of $T_2$ connected to the collector of $T_1$, a closed loop with gain $\beta_1\beta_2$ is formed. This closed-loop gain is the key to operation of the controlled rectifier. With $T_1$ base current at zero, loop gain will be less than one, but as $T_1$ base current is increased, an increase in collector current occurs and gain increases. This process continues with an increase in $T_1$ base current until loop gain equals one. The circuit then becomes self-regenerative, driving collector currents of both transistors $T_1$ and $T_2$ toward saturation. In the controlled rectifier counterpart, a loop gain $\beta_1\beta_2<1$ represents the "off" state, whereas $\beta_1\beta_2\geqq 1$ represents the "on" connected to the collector of $T_2$, and the base of $T_2$ constate.

The reverse characteristic of a conventional controlled rectifier is similar to that of any diode. In the forward direction, leakage conduction, which is caused by collector currents of $T_1$ and $T_2$ during the period when $\beta_1\beta_2<1$, increases until the forward breakover point is reached, where $\beta_1\beta_2\geqq 1$, and forward voltage then drops to a very low level, while forward current becomes essentially dependent upon load.

The use of different gate currents affects the forward breakover voltage as well as leakage current. As gate current is increased, leakage current increases and breakover voltage decreases.

It is an object of the present invention, therefore, to provide a novel solid-state relay using controlled rectifiers.

It is another object of the present invention to provide a simple solid-state controlled rectifier relay having input-output isolation, snap action, and no moving parts.

According to the preferred embodiment of the present invention, a solid-state relay for A.C. switching comprises a pair of controlled rectifiers connected in parallel and oppositely poled with respect to each other. The control electrode of each controlled rectifier is coupled to an oscillator through an isolation transformer. Only one of the controlled rectifiers conducts at a time.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings, in which:

Figure 1:
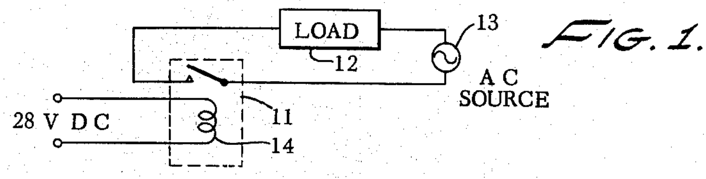
FIGURE 1 is a schematic diagram of a typical mechanical relay.

Turning now to the drawings, FIGURE 1 shows relay 11 coupled to load 12 and A.C. source 13, with a 28 volt D.C. control voltage being supplied to coil 14 of relay 11. The contact of relay 11 is normally open, in which condition there is no current through load 12. When the input D.C. is applied to coil 14, the contact closes, and current passes through load 12. The mechanical relay shown has a D.C. coil and an A.C. contact. The solid-state substitute for mechanical relay 11 will now be described.

Figure 2:
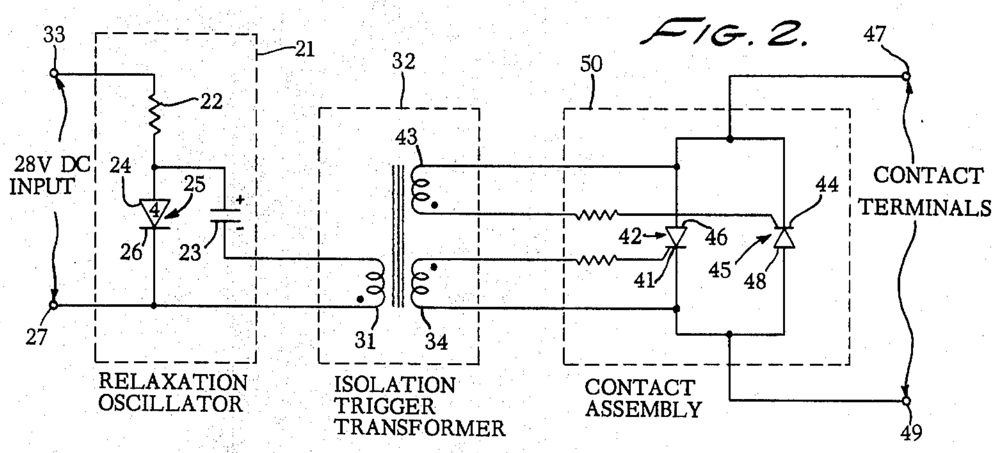
FIGURE 2 is a schematic diagram of a circuit according to the present invention.

FIGURE 2 shows relaxation oscillator 21 having resistor 22, one terminal of which is connected to one plate of capacitor 23 and to anode 24 of four-layer diode 25. The other plate of capacitor 23 is connected both to cathode 26 of diode 25 and to input terminal 27 through primary winding 31 of isolation trigger transformer 32. The other terminal of resistor 22 is connected to input terminal 33.

Secondary winding 34 of isolation trigger transformer 32 is coupled across the control electrode and cathode 41 of controlled rectifier 42. Secondary winding 43 of isolation trigger transformer 32 is coupled across the control electrode and cathode 44 of controlled rectifier 45. Cathode 44 is connected to anode 46 of controlled rectifier 42 and to contact terminal 47. Cathode 41 is connected to anode 48 of controlled rectifier 45 and to contact terminal 49. The parallel combination of controlled rectifiers 42 and 45 forms contact assembly 50.

In the normal condition, the contact is open, and there is no current between contact terminals 47 and 49. When D.C. power is applied to input terminals 27 and 33, free-running relaxation oscillator 21 goes into operation. A very satisfactory frequency of operation has been found to be 10 kc. with a 28 volt D.C. input. Capacitor 23 charges until the breakdown voltage of diode 25 is exceeded, at which time the voltage across diode 25 drops back to a very low value, because of the inherent nature of four-layer diodes. At that time, capacitor 23 discharges through primary winding 31. The pulse current from the discharge develops a voltage across primary 31. Secondary windings 34 and 43 then supply gate or control current to controlled rectifiers 42 and 45. The frequency of the gate pulses is high, causing the controlled rectifiers to "fire" within a few degrees after the cathode-to-anode potential becomes positive.

Figure 4:
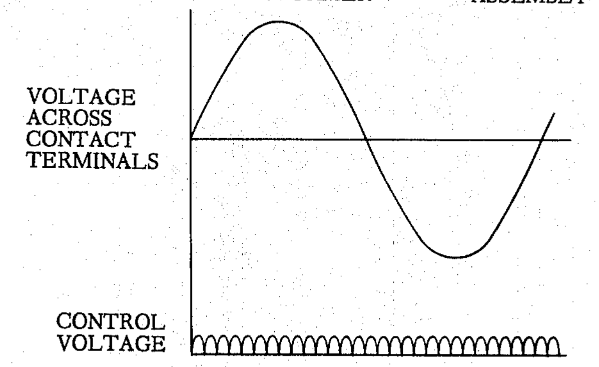
FIGURE 4 is a graph of some of the waveshapes present in the circuit of FIGURE 2.

FIGURE 4 shows that the frequency of the control voltage is much higher than that of the voltage across contact terminals 47 and 49. Although the control voltage may be out of phase with the voltage across the contact terminals, the frequency of the former is so much higher than that of the latter that, under the worst conditions, the time interval between the application of the control voltage and the firing of the controlled rectifiers will be very slight, substantially resulting in relay snap action. Relay snap action is obtained because the relaxation oscillator has the characteristic of putting out full output voltage as soon as a critical supply voltage is reached.

Input and output isolation is achieved through the use of isolation trigger transformer 32, but it should be noted that transformer 32 is not essential to the operation of contact assembly 50, if isolation is not necessary for the particular use intended. If snap action were not required, relaxation oscillator 21 could be replaced by a transistor or blocking oscillator.

The circuit shown serves as an excellent power relay, in that it has litle power dissipation. Only one controlled rectifier conducts at any given time.

Figure 3:
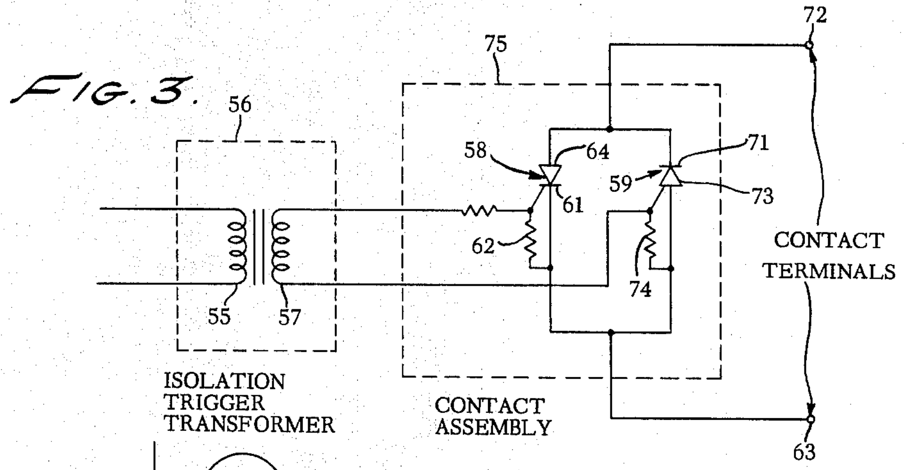
FIGURE 3 shows a different embodiment of the present invention.

FIGURE 3 shows how complementary controlled rectifiers can be used, so that only one secondary transformer winding is necessary. The input pulses are applied to primary winding 55 of isolation trigger transformer 56. Secondary winding 57 of transformer 56 is coupled across the control electrode of PNPN controlled rectifier 58 and the control electrode of NPNP controlled rectifier 59. Cathode 61 of controlled rectifier 58 is connected to its control electrode through resistor 62 and to contact terminal 63. Anode 64 of controlled rectifier 58 is connected to cathode 71 of controlled rectifier 59 and to contact terminal 72. Anode 73 of controlled rectifier 59 is connected to its control electrode through resistor 74 and to contact terminal 63. The parallel combination of controlled rectifiers forms contact assembly 75.

NPNP controlled rectifier 59 is a complementary controlled rectifier in that it has anode and cathode electrodes connected to its N and P regions, respectively, and a control electrode connected to its inner N-type region. Controlled rectifier 59 is thus complementary to conventional PNPN controlled rectifier 58, which has anode and cathode electrodes connected to its outer P and N regions, respectively, and a control electrode connected to its inner P-type region. Complementary controlled rectifier 59 requires negative gate current triggering while conventional controlled rectifier 58 requires positive gate triggering.

A complementary controlled rectifier can be made as follows: diffuse a P-type silicon wafer with a donor material such as phosphorous, to form an N-type region all around the wafer. The silicon dioxide coating that invariably forms on the outside should be etched away, along with a little of the underlying N-type region, on one surface. Diffuse the device with an acceptor material such as boron, to form a P-type region on the exposed N-type region. The silicon dioxide coating will have masked all the surfaces, except the one surface that was etched. The sides of the device should then be etched, to remove the N-type region therefrom, leaving a four-layer device. Etch a hole through the P-type region to expose the underlying N-type region, so that a gate electrode can be connected thereto. Then connect anode and cathode electrodes to the end layers.

While particular embodiments of the present invention have been shown and described, it will be obvious to those skilled in the art that changes and modifications may be made without departing from this invention in its broader aspects, and, therefore, the aim in the appended claims is to cover all such changes and modifications as fall within the true spirit and scope of this invention.

I claim:

1. A solid state relay comprising: an oscillator having an input and an output; means for applying a direct-current signal to said input; a first controlled rectifier having a control electrode; means for coupling said first controlled rectifier to a source of alternating current; a second controlled rectifier having a control electrode; means connecting said second controlled rectifier across said first controlled rectifier and oppositely poled with respect thereto; and means coupling the output of said oscillator with said control electrodes of said controlled rectifiers, each of said rectifiers being rendered alternately conductive for a complete half-cycle of said alternating current in response to an output signal from said oscillator.

2. A solid state relay comprising: a relexation oscillator having an input and an output; means for applying a direct-current signal to said input; an isolation trigger transformer coupled to the output of said oscillator; a first controlled rectifier; means for coupling said first controlled rectifier to a source of alternating current; and a second controlled rectifier connected across said first controlled rectifier and oppositely poled with respect thereto, each of said controlled rectifiers having a control electrode coupled to said isolation transformer and only one of said controlled rectifiers being able to conduct at any given time.

3. A solid state relay for use with a source of alternating current comprising: a relaxation oscillator having an input and an output; means for applying a direct-current signal to said input; a first controlled rectifier having a control electrode; means for coupling said first controlled rectifier to said source of alternating current; a second controlled rectifier having a control electrode; means connecting said second controlled rectifier across said first controlled rectifier and oppositely poled with respect thereto; and a transformer coupled to said output of said oscillator and to said control electrodes of said controlled rectifiers, each of said rectifiers being rendered alternately conductive for a complete half-cycle of said alternating current in response to an output signal from said oscillator.

4. The relay of claim 3 wherein said transformer has a primary winding and first and second oppositely wound secondary windings, said primary winding being coupled to the output of said oscillator and said secondary windings being coupled to said control electrodes of said first and second controlled rectifiers respectively.

5. The relay of claim 3 wherein said transformer winding has a primary winding and a secondary winding, said primary winding being coupled to the output of said oscillator and said secondary winding being coupled to said control electrodes of said first and second controlled rectifiers respectively, said first rectifier being of PNPN configuration and said second rectifier being of NPNP configuration.

6. A solid state relay for use in an alternating current circuit, comprising a relaxation oscillator having an input and an output; means for applying a direct-current signal to said input, said oscillator producing an output signal having a substantially higher frequency than the alternating current in said circuit; a transformer coupled to the output of said oscillator; a first controlled rectifier; means for coupling said first controlled rectifier in said alternating current circuit; and a second controlled rectifier connected across said first controlled rectifier and oppositely poled with respect thereto, each of said controlled rectifiers having a control electrode coupled to said transformer and only one of said controlled rectifiers being able to conduct at any given time.

7. A solid state relay comprising: a relaxation oscillator having an input and an output; means for applying a direct-current signal to said input; an isolation trigger transformer having primary winding means and secondary winding means, said primary winding means being coupled to the output of said oscillator to receive an output signal therefrom; a first controlled rectifier having a control electrode; means for coupling said first controlled rectifier to a source of alternating current; a second controlled rectifier having a control electrode; means connecting said second controlled rectifier across said first controlled rectifier and oppositely poled with respect thereto; and means coupling the control electrode of each of said rectifiers to said secondary winding means of said transformer, only one of said controlled rectifiers being able to conduct at any given time.

8. The relay of claim 7 wherein said oscillator output signal has a high frequency of oscillation relative to the frequency of the source of alternating current to be coupled to said first controlled rectifier.

9. The relay of claim 8 wherein said primary winding means comprises a single winding and said secondary winding means comprises first and second oppositely wound windings, said primary winding being coupled to the output of said oscillator and said secondary windings being coupled to said control electrodes of said first and second controlled rectifiers respectively.

10. The relay of claim 8 wherein said primary winding means comprises a single winding and said secondary winding means also comprises a single winding, said primary winding being coupled to the output of said oscillator and said secondary winding being coupled to said control electrodes of said first and second controlled rectifiers respectively, said first rectifier being of PNPN configuration and said second rectifier being of NPNP configuration.

References Cited by the Examiner

UNITED STATES PATENTS

| | | |
|---|---|---|
| 2,745,038 | 5/1956 | Sziklai. |
| 3,048,710 | 8/1962 | Shockley. |

OTHER REFERENCES

General Electric Notes on Application of the Silicon Controlled Rectifier, December 1958. (Pages 41 to 43, page 41 relied on.)

ARTHUR GAUSS, *Primary Examiner.*